United States Patent [19]

Heberling

[11] Patent Number: 4,938,701
[45] Date of Patent: Jul. 3, 1990

[54] CONNECTING BRACKET FOR MODULAR CIRCUIT BOARDS

[75] Inventor: James R. Heberling, Lawrenceville, Ga.

[73] Assignee: Hayes Microcomputer Products, Inc., Norcross, Ga.

[21] Appl. No.: 248,823

[22] Filed: Sep. 23, 1988

[51] Int. Cl.⁵ ............................................. H01R 9/09
[52] U.S. Cl. ....................................... 439/65; 439/74; 439/79; 439/327; 439/629
[58] Field of Search ................. 439/44, 55, 64, 65, 439/74, 79, 289, 325, 327, 328, 377, 629, 631

[56] References Cited

U.S. PATENT DOCUMENTS

| | | | |
|---|---|---|---|
| 3,181,101 | 4/1965 | Fox | 439/79 |
| 3,653,006 | 3/1972 | Kohler et al. | 439/74 |
| 3,784,954 | 1/1974 | Grimm et al. | 439/65 |
| 4,060,295 | 11/1977 | Tomkiewicz | 439/55 |
| 4,695,112 | 9/1987 | Maston et al. | 439/629 |
| 4,712,848 | 12/1987 | Edgley | 439/327 |

*Primary Examiner*—P. Austin Bradley
*Attorney, Agent, or Firm*—Jones, Askew & Lunsford

[57] ABSTRACT

The present invention provides an interconnecting bracket for releasably connecting two circuit boards in an end-abutting relationship. The bracket is fastened to one circuit board in a relatively permanent manner, and is fastened to the second circuit board by the combination of a barbed locking finger which downwardly engages a hole defined by the second circuit board, a noduled foot which upwardly bears upon the lower primary planar surface of the second circuit board, and a positioning flange which nestles within an open-ended slot defined by the second circuit board. The resulting configuration allows a typical computer user to releasably fasten the two boards without tools and special manual skills.

3 Claims, 2 Drawing Sheets

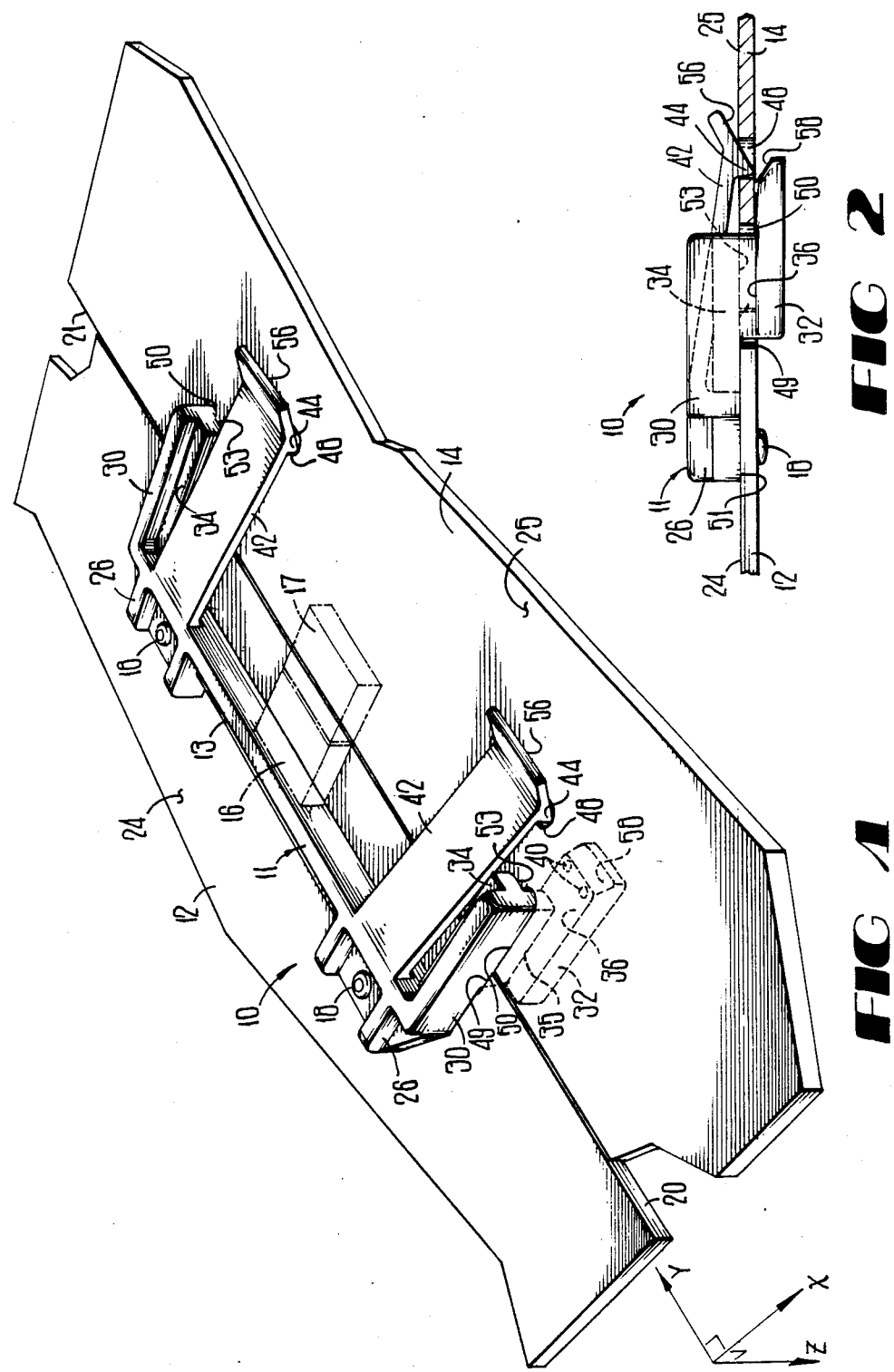

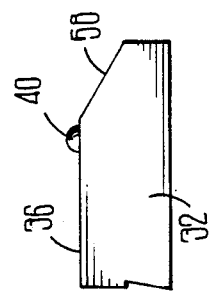
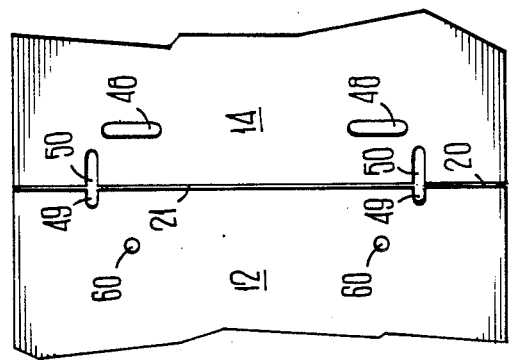
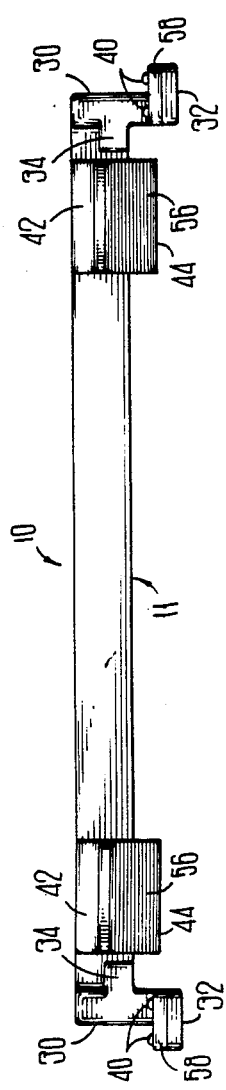
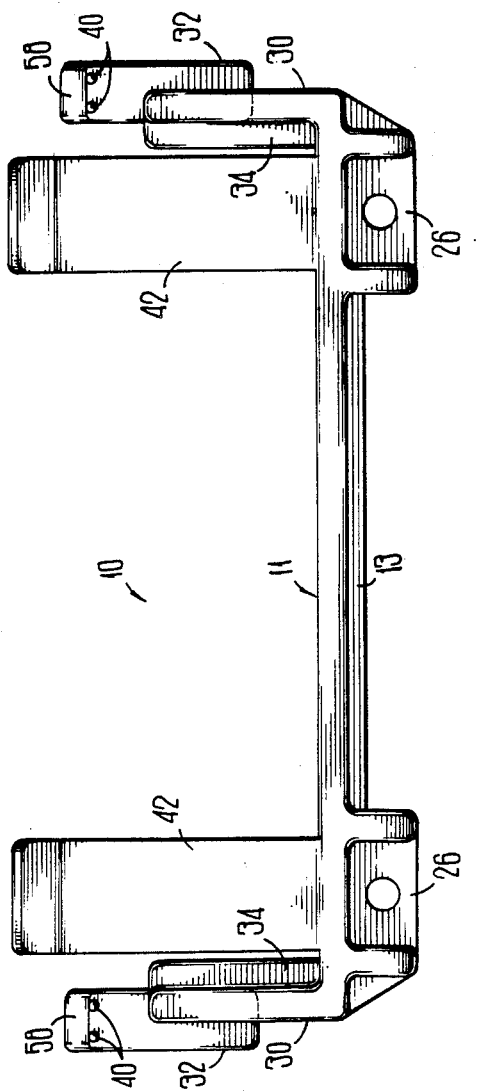

CONNECTING BRACKET FOR MODULAR CIRCUIT BOARDS

TECHNICAL FIELD

The present invention relates to circuit boards, and more particularly relates to a device for interconnecting individual circuit boards in an end-abutting modular fashion.

BACKGROUND OF THE INVENTION

In computer operation, especially personal computer operation, it is often desirable to utilize peripheral devices known as modems which allow a computer to send an receive data across conventional telephone lines. As known in the art, and to most users of computers, modems (a contraction for modulator/demodulator) are devices which convert digital signals from a computer or terminal into a modulated signal appropriate for transmission across conventional telephone lines. Most modems for personal computers use a modulation technique which is appropriate for transmission over the relatively narrow usable bandwidth of conventional phone lines.

Many personal computers in use today utilize a hardware architecture by which peripheral devices are connected to expansion slots on the mother board of the computer, as opposed to serial or parallel ports with plug connections which are external to the computer cover. A number of peripherals or expansion devices may be inserted into the expansion slots and the normal cover for the computer may then be replaced. This arrangement allows the user to expand the capabilities of the computer without a corresponding expansion of the number of boxes and cables lying about the computer installation site.

In the marketing of personal computers, a trade-off is often necessary between the physical size of the compound and the number of expansion slots made available to the user. Therefore, inter-slot spacing in such computers is kept to a practical minimum. Modems and other devices constructed upon a single circuit board which occupy only a single expansion slot of a small computer are desired by users.

It is known in the art to provide such "internal" modems of varying degrees of sophistication upon a single circuit board installed within a single expansion slot of a small computer. However, often a consumer who has bought a relatively low-level modem may desire to upgrade the modem's capabilities. This creates a dilemma in that the old low-level modem is effectively rendered obsolete, as an entirely new circuit board is required to be installed in place of the old circuit board. This is disadvantageous in that the old low-level circuit board tends to have a low resale value, and is often of little further use to the upgraded user.

Therefore, it may be seen that a need exists for a circuit board configuration which allows for a space- and cost-effective manner of upgrading modem capabilities.

SUMMARY OF THE INVENTION

The present invention solves deficiencies in the prior art by providing a connecting bracket which allows two circuit boards to be connected physically and electrically in an end-abutting relationship, such that an additional "upgrade" circuit board can be added to an existing modem board. Upgrades are made to the existign circuit board in a cost-effective manner by utilizing existing hardware and adding only upgrade hardware, and in a space-effective manner by allowing the additional upgrade board to occupy the same expansion slot as the existing board and not adjacent expansion slots.

Generally described, the present invention provides a connecting bracket for connecting a first circuit board having an upper and a lower primary surface and an end, to a second circuit board having an upper and a lower primary surface and an end, the second circuit board defining at least one hole extending through its thickness and defining at least one open-ended slot extending through its thickness and positioned along its end, comprising means for attaching the bracket to the first circuit board such that the end of the circuit board is substantially unobstructed; at least one finger means extending from the bracket and including a barb for engaging the hole of the second circuit board; at least one foot means extending from the bracket, the foot including at least one nodule extending upwardly therefrom, the foot and nodule defining an upper supporting surface for engaging the lower primary planar surface of the second circuit board; and at least one positioning flange means extending from the bracket for engaging the open-ended slot of the second circuit board, such that the finger means, foot means, and positioning flange means engage the second circuit board and the first and second circuit board are connected by the bracket in an end-abutting relationship.

Thus it is an object of the present invention to provide an improved connecting bracket for circuit boards.

It is a further object of the present invention to provide an improved connecting bracket for circuit boards to allow them to be connected physically and electrically in a manner such that the ends of the circuit boards are abutting.

It is a further object of the present invention to provide an improved connecting bracket for circuit boards to allow them to connected physically and electrically in cost- and space-effective manner.

It is a further object of the present invention to provide a connecting bracket for circuit boards, which allow a second board to be connected to a first circuit board without special tools or experience.

It is a further object of the present invention to provide a connecting bracket for circuit boards, which allows a second board to be connected to a first circuit board such that both boards may be installed in the same expansion slot of a computer.

Other objects, features and advantages of the present invention will become apparent from reading the following specification when taken in conjunction with the accompanying drawing.

BRIEF DESCRIPTION OF THE DRAWING

FIG. 1 is a perspective view of an embodiment of the connecting bracket, illustrating the connecting bracket connecting two separate circuit boards.

FIG. 2 is a side plan view of the embodiment as shown in FIG. 1.

FIG. 3 is an isolated front plan view of the connecting bracket shown in FIG. 1.

FIG. 4 is an isolated top plan view of the connecting bracket shown in FIG. 1.

FIG. 5 is a top illustrative view of the relative positioning of the two circuit boards when attached, except that the connecting bracket is not shown.

FIG. 6 is a side isolated plan view of one of the ends of one foot of the bracket of the present invention, illustrating the nodules extending upwardly from the foot.

DETAILED DESCRIPTION OF THE PREFERRED EMBODIMENT

Referring now in more detail to the drawing, in which like numerals indicate like parts throughout the several views, FIG. 1 shows an interconnecting bracket 10 in use, allowing for an end-abutting relationship between a typical expansion board 12 (also known in the art as an "expansion card") and a main circuit board 14, which allows for an electrical connection between typical electrical connectors 16, 17 attached by means known in the art to the expansion board 12 and the main circuit board 14, respectively.

For purposes of this description, terms such as "upper", "lower", "front", and "rear" will be used for purposes of clarity. However, it should be understood that such terms are only relative, and are intended only to be used in describing the figures, and not to indicate the preferred orientation of the described elements. It should be understood that when installed within an expansion slot within a computer, the primary planar surfaces of the circuit boards will be substantially vertical, instead of horizontal as shown in the figures.

Referring to FIGS. 1 and 2, it may be noted that interconnecting bracket 10 is fixed to expansion board 12 by rivets 18 or other means known in the art. The interconnecting bracket 10 is configured to accept and releasably grasp one end of main circuit board 14 in a manner such that the ends 20, 21 of the expansion board 12 and main circuit board 14, respectively, are in an end-abutting relationship, such that the upper planar surface 24 of expansion board 12 is substantially coplanar to the upper planar surface 25 of main circuit board 14. It should be understood that the preferred embodiment of the invention contemplates upper planar surface 24 and upper planar surface 25 of the respective circuit boards 12, 14, to be the "component" side of the circuit boards, with the lower planar surfaces being the respective "foil" sides, although the reverse orientation could be used without departing from the spirit and scope of the invention.

Referring now to FIG. 1, for purposes of explanation, reference is made to three mutually perpendicular axes X, Y and Z. Interconnecting bracket 10 includes a substantially elongate body 11 including a rear ledge 13, the body having its longitudinal axis substantially parallel to axis, Y, and having a substantially "L-shaped" transverse cross section. Two mounting flanges 26 extend rearwardly in a direction substantially parallel to axis X. This direction, relative to the body 11 of the bracket 10, will now be generally be referred to as the "rearward" direction. A pair of positioning flanges 30 also extend "-forwardly" from the bracket, in a direction generally parallel to axis X, and from each inwardly extends a retaining shelf 34. From the forward bottom of each positioning flange downwardly extends a foot 32 attached to the positioning flange at 35. Each of these feet 32 includes a pair of nodules 40 extending upwardly from the feet. The feet 32 and nodules 40 combine to define an upper supporting surface 36. As discussed later in this application, these nodules bear upon the lower planar surface of main circuit board 14, when the circuit board is grasped by the bracket 10.

Bracket 10 also includes a pair of locking fingers 42 each extending from each end of body 11 in a generally forward direction, except that the fingers are each inclined downwardly somewhate as they extend forwardly. Each finger 42 includes a downwardly-directed barb 44, each of which, as discussed later in this application, engages corresponding closed slots 48, each defined by and extending through the main circuit board 14.

Referring now to FIGS. 1 and 2, assembly of the bracket 10 to expansion board 12 and subsequent attachment of this subassembly to main circuit board 14 is now discussed. Bracket 10 is aligned with holes 60 (see only FIG. 5) defined by expansion board 12 which correspond to holes (not numbered) defined by mounting flanges 26, such that a lower rearward portion of each positioning flange passes through corresponding open-ended slots 49 defined by expansion board 12 (see FIG. 5 for slots), and such that a rearward portion of each upper supporting surface 36 is in contact with or is closely facing (depending on tolerances) the lower planar surface of main circuit board 14. Upon alignment, rivets 18 or other fastener means known in the art are inserted to rigidly affix bracket 10 to expansion board 12. It should be understood that at this time, lower surface 51 of body 11 (see only FIG. 2) is in face-to-face contact witht he upper surface 24 of expansion board 12. It should also be understood that lower surface 53 of retaining shelf 34 is substantially coplanar to lower surface 51 of body 11.

To attach expansion board 12 to main circuit board 14, the upper surfaces 24 of the two boards are aligned such that they are substantially coplanar, and the ends 20, 21, respectively, of the two boards are facing each other. The two boards are then drawn toward each other, while maintaining their upper planar surfaces in a substantially coplanar relationship. Eventually, the end 21 of main circuit board 14 will come in contact with the inclined guiding surface 56 of each locking finger 42. This will tend to urge the end 21 of the main circuit board 14 downwardly relative to the expansion board 12 as it slides along the inclined guiding surface 56 of each locking finger. As the two boards are further urged toward each other, the end 21 of the main circuit board 14 will then come in contact with guiding surface 58 defined by each foot 32. At this time, the end 21 of the main circuit board 14 will be effectively nestled between the two surfaces 56, 58. It should be understood that in the preferred embodiment the upward deflectability of the locking fingers 42 is greater than the downward deflectability of the feet 32, although the reverse is still contemplated by the present invention. As the main circuit board is further urged toward the expansion board 12, the locking fingers 42 will tend to deflect upwardly, eventually allowing the lower surface of the main circuit board 14 to come in sliding contact with the nodules 40 defined by feet 32. At the same time, the barbs 44 of the locking fingers 42 will be bearing against the upper surface 25 of main circuit board 14. As the main circuit board 14 is further urged toward the expansion board 12, open ended slots 50 defined by main circuit board 14 (see only FIG. 5) are aligned in such a manner that these slots each accept a positioning flange 30 while at the same time the lower surfaces 53 of each retaining shelf 34 are in sliding contact with the upper surface 25 of the main circuit board 14. It should be understood that slots 50 each now face corresponding open ended slots 49, due to the aligning effect of the flanges 30 extending therebetween. At this time, the aligning feature of the bracket 10 is evident, as the main circuit board is prevented from traveling upwardly relative to the expansion board 12 by the shelves 43, prevented from traveling downwardly by feet 32, prevented from moving laterally or rotating in a plane normal to the upper surface 25 of the main circuit board 14 by the interaction of open ended slots 49, 50 and positioning flanges 30, and prevented from being separated from the expansion board 12 by the engagement of barbs 44.

As the main circuit board 14 is further urged toward the expansion board 12, eventually the end 21 fo the main circuit board 14 will contact end 20 of the expansion board 12 in an end-abutting relationship. Preferably, the positioning flanges 30 will be almost completely nestled within the open ended slots 50 defined by main circuit board 14, by maximum aligning affect.

As the two circuit boards become positioned in their end-abutting relationship, the closed slots 48 will come in alignment with barbs 44, and the free ends of the locking fingers 42 will snap downwardly, with the barbs 44 engaging the closed slots 48. It may be seen that such engagement effectively prevents separation of the main circuit board 14 from expansion board 12, unless the locking fingers are disengaged.

The inclusion and configuration of the nodules 40 is an important feature of the invention. Should some misalignment be present due to manufacturing tolerances between elements 10, 12, and 14, excessive friction encountered by particular nodules 40 will cause them to wear excessively. This wear may cause more proper alignment between the two circuit boards 12, 14. The preferred shape of the nodules is of a half-sphere, with the spherical part fo the half spheres extending upwardly and being part of upper supporting surfaces 34 of each of feet 32 (see only FIG. 6).

It should be understood that the spherical configuration of the nodules allows the tops of the nodules, being somewhat small in horizontal cross section, to wear more rapidly for a given frictional force than will the midsection and base horizontal cross sections of the nodules. Thus the previously discussed "self-aligning" feature is assisted by this configuration of the nodules, which may be termed for purposes of this application to be a "tapering" configuration, with the sides of the nodules tapering outwardly as they extend downwardly (although not linearly). However, it should be understood that the nodules could be of other tapering configurations, such as a cone or truncated cone configuration. It should also be understood that the invention also contemplates non-tapering configurations such as cylindrical configuration with the longitudinal axis of the cylinder being substantially vertical. Other nontapering configurations are also contemplated, such as those having square or rectangular transverse cross sections.

It may be seen that the above-described method of connection allows not only for the end-abutting physical connection between the two circuit boards 12, 14, but the electrical connection between typical connectors 16, 17, which themselves are electrically connected to the respective circuit boards 12, 14, by means and manners known in the art. Although many different electrical connectors may be used, one embodiment used by the applicant in a modem application includes the use of an "AMP"-brand double-row 30-pin receptacle, part no. 1-102584-3 for connector 17, and an "AMP"-brand double-row 30-pin header, part no. 1-102584-3 for connector 16. Reversal of these elements is another embodiment of the invention. It should be understood that the particular connectors 16, 17, used to themselves include a self-aligning function, as connector 17 slides within connector 16 within and along axis X during insertion. This feature is an advantageous, although not critical, part of the invention.

After the two circuit boards are connected as described above, they may then be rotated along an axis substantially parallel to axis X, and then inserted into an expansion slot (not shown) within a typical computer in the same manner as the main circuit board was initially installed. It should be understood that this is an important feature of the invention in that no adjacent expansion slots are used, thus resulting in the effective use of space within the computer.

To separate main circuit board 14 from expansion board 12, it is necessary to simultaneously lift both of the locking fingers 42 such that the barbs 44 become disengaged from closed slots 48. Upon disengagement, the two circuit boards 12, 14 may be separated in a manner opposite to the above-discussed assembly technique.

It may be seen that the above-discussed assembly procedure requires no tools and may be executed by one having a relatively low degree of manual skill. Therefore, it may be seen that this assembly technique may be exercised by the typical consumer, which is an important feature of the present invention, as no additional installment expenses may be incurred by that consumer in installing the expansion board 12.

It should be understood that the above bracket 10 is used in the preferred embodiment to connect an internal modem circuit board to an expansion board. However, such a bracket could be used in a wide variety of applications not restricted to modem applications. For example, such a modular arrangement could be used in memory boards, or any circuit board application which benefits from the use of an end-abutting relationship with electrical connections.

The bracket may be constructed of a wide variety of materials without departing from the scope of the present invention, although the preferred construction is a one-piece construction using a nylon material having the designation known by the industry as "6—6".

Therefore, it may be seen that the above invention provides improvements over the prior art in that electrical circuit boards may be arranged in an end-abutting relationship with physical and electrical integrity, in a cost- and space-effective manner. The main circuit board 14 is not required to be discarded, thus resulting in a cost savings, and only one expansion slot is required, thus resulting in space savings. Furthermore, the technique required to assemble the two elements is not overly complex, and may be executed by one having a relatively low level of assembly skills, thus resulting in additional cost savings, as the consumer may add the expansion board without incurring installation costs.

It should be understood that the foregoing relates only to a preferred embodiment of the present invention, and that numerous modifications or alterations may be made therein without departing from the spirit and scope of the invention as set forth in the appended claims.

What is claimed is:

1. A connecting bracket for connecting a first circuit board having an upper and a lower primary surface and an end, to a second circuit board having an upper and a lower primary surface and an end, said second circuit board defining at least one hole extending through its thickness and defining at least one open-ended slot extending through its thickness and positioned along its end, comprising:

means for attaching said bracket to said first circuit board such that said end of said circuit board is substantially unobstructed;

finger means extending from said bracket and including a barb for engaging said hole of said second circuit board;

foot means extending from said bracket, said foot including a nodule extending upwardly therefrom, said foot and nodule defining an upper supporting surface for engaging said lower primary planar surface of said second circuit board; and positioning flange means extending from said bracket for engaging said open-ended slot of said second circuit board.

such that said finger means, foot means, and positioning flange means engage said second circuit board and said first and second circuit board are connected by said bracket in an end-abutting relationship.

2. A connecting bracket as claimed in claim 1, wherein said nodule is tapered and provides a self-aligning feature.

3. A connectig bracket as claimed in claim 1, further comprising a first electrical connector attached to said first circuit board, and a second electrical connector attached to said second circuit board, said first and said second electrical connectors being electrically engaged when said first and second circuit boards are in said end-abutting relationship.

* * * * *